United States Patent
Poirrier et al.

(10) Patent No.: US 8,307,257 B2
(45) Date of Patent: Nov. 6, 2012

(54) DECODING METHOD AND DEVICE USING ERROR CORRECTION CODES

(75) Inventors: Julien Poirrier, Locquemeau (FR); Michel Joindot, Lannion (FR)

(73) Assignee: France Telecom, Paris (FR)

( * ) Notice: Subject to any disclaimer, the term of this patent is extended or adjusted under 35 U.S.C. 154(b) by 1308 days.

(21) Appl. No.: 11/906,744

(22) Filed: Oct. 3, 2007

(65) Prior Publication Data

US 2008/0168327 A1    Jul. 10, 2008

(30) Foreign Application Priority Data

Oct. 3, 2006  (FR) ..................................... 06 54059

(51) Int. Cl.
   *H03M 13/00* (2006.01)
(52) U.S. Cl. ........................ 714/759; 714/780
(58) Field of Classification Search ................ 714/752, 714/755, 758, 781, 784, 785
   See application file for complete search history.

(56) References Cited

U.S. PATENT DOCUMENTS

| | | | |
|---|---|---|---|
| 5,488,366 A * | 1/1996 | Wu ................................ | 341/67 |
| 6,161,210 A * | 12/2000 | Chen et al. .................... | 714/786 |
| 7,278,123 B2 * | 10/2007 | Ravi et al. ..................... | 714/738 |
| 2001/0046271 A1 * | 11/2001 | Jonas et al. ................... | 375/347 |

FOREIGN PATENT DOCUMENTS

| | | |
|---|---|---|
| WO | WO 01/35536 A1 | 5/2001 |
| WO | WO 2006/061491 A1 | 6/2006 |

OTHER PUBLICATIONS

Lancelot Pecquet, "List Decoding of Algebraic-Geometric Codes", Internet Article [Online], Jun. 13, 2001, URL:http://citeseer.ist.psu.edu/cache/papers/cs/23076/http:zSzzSwww-rocq.inria.frzSzSzcodeszSzLancelot.PecquetzSzprozSzarticleszSzlistdec.pdf/Pecquet01list.pdf.

V. Guruswami et al., "Improved decoding of Reed-Solomon and Algebraic-Geometric Codes", Foundations of Computer Science, 1998. Proceedings. 39th Annual Symposium in Palo Also, CA, USA, Nov. 8-11, 1998.

J. Hokfelt et al., "Optimizing the energy of different bit streams of turbo codes", Turbo Coding Seminar Proceedings, Aug. 1996, pp. 59-63.

* cited by examiner

*Primary Examiner* — John Trimmings
*Assistant Examiner* — Daniel McMahon
(74) *Attorney, Agent, or Firm* — Cozen O'Connor (57) ABSTRACT

The invention provides a method of decoding a decided signal received from a decision circuit to supply a decoded signal, said method comprising:

a step of detecting a word of N bits in said received decided signal to supply a detected word;

a step of selecting an admissible word of N bits in a dictionary of the error correction code used for encoding in accordance with a criterion of the shortest distance between said detected word and said selected admissible word; and a step of decoding a word of L bits constituting said decoded signal from said selected admissible word.

According to the invention, the distance used in the selection step takes account of the relative reliabilities of $2^K$ sequences of K bits, $0<K<N$.

14 Claims, 8 Drawing Sheets

DECODING METHOD AND DEVICE USING ERROR CORRECTION CODES

FIELD OF THE INVENTION

The invention relates to a method of decoding a decided signal received from a decision circuit to supply a decoded signal.

The invention also relates to a decoder using such a method.

The invention further relates to a decoder device using such a decoder.

The invention further relates to a receiver using such a decoding device.

The invention finally relates to a computer program implementing such a method when it is executed by a processor.

The field of the invention is that of telecommunications networks, and more particularly that of decoding an error correction code used to transmit information over telecommunications networks.

PRIOR ART

Figure 1A:
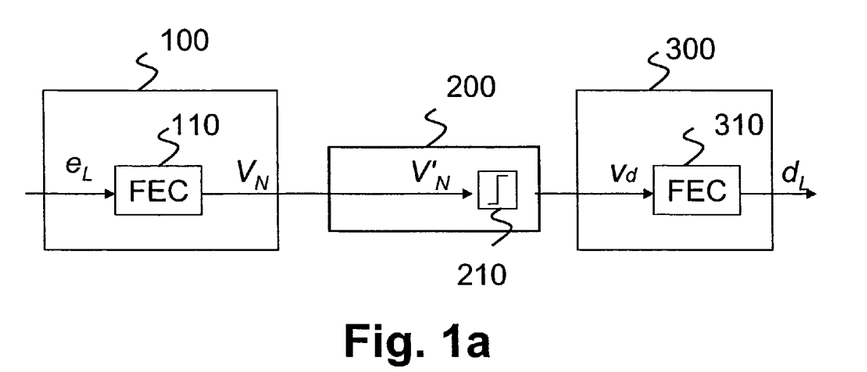
FIG. 1a is a block diagram showing the functional structure of a prior art encoding, transmission, and decoding system.

FIG. 1a represents a system for transmitting a signal in a telecommunications network using such an error correction code. Such a system comprises a sender 100 adapted to receive an input signal $e_L$ and to send an encoded signal $V_N$ over a binary transmission channel 200. The sender 100 includes a forward error correction (FEC) encoder 110 for adding redundancy to the input signal $e_L$ in the following manner: the input signal $e_L$ is considered to be formed of a series of words of L bits, 0<L<N, called payload words or information words, since these L bits constitute the information to be transmitted over the channel. The principle of the error correction code is to associate with a payload word a word of N bits where N is an integer greater than L. The signal $w_N$ is sent on the binary channel 200. A signal $V'_N$ is received by a decision circuit 210, which detects the information transported on the channel and translates the result of the decision into the form of a binary decided signal $V_d$. That binary decided signal is received by a receiver 300 including an FEC decoder 310 for supplying a decoded signal $d_L$ based on the decided signal $V_d$. The FEC decoder 310 uses the redundant information contained in the N–L bits to retrieve the payload word sent in the following manner: of all possible words of N bits, only some are admissible. These admissible words, called code words, form part of a dictionary that is characteristic of the error correction code concerned. This restriction makes it possible not only to recognize a word of N bits that does not belong to the family of possible words in the error correction code, but also to detect and where applicable correct transmission errors. The FEC decoder 310 selects the word of N bits that conditionally most closely resembles the decided signal $V_{Nd}$ that has been detected and sends the word of L bits that corresponds to it. It can be shown that this is equivalent to deciding that the word $W_N$ of N bits sent is the word of the error correction code closest to the word $V_{Nd}$ that has been decided on from the set of words of N bits (i.e. the set $[0,1]^N$), in the sense of a distance called the Hamming distance, which is defined as follows:

$$d(V_{Nd}, W) = \sum_{i=1}^{N} \delta_{v_i w_i} = card(v_i \mid v_i \neq w_i) = card(w_i \mid w_i \neq v_i) = d(W, V_{Nd})$$

The distance between two words is calculated as the cardinal number of the set of bits on which they differ. For example, the distance between the two words of 5 bits (1,0,0,1,0) and (1,1,1,0,0) is 3. The distance between two words is a quantitative measure of their resemblance: the closer they are together, the more bits they have in common, and thus the more they resemble each other. It can therefore be said that the decoder chooses the code word that most resembles the detected word.

The error correction capacity of the code is linked to the minimum distance between two words of the code.

The distance between the code word W and the word $V_{Nd}$ can also be interpreted as the number of erroneous decisions that have occurred and that have led to choosing $V_{Nd}$ when in fact W was sent.

The mechanism for decoding error correction codes is based on the assumption of a symmetrical binary channel, i.e. a channel where the conditional probabilities are equal. More precisely, by symmetrical binary channel is meant a channel transmitting information in the form of bits [0,1] for which the probability of deciding on a 0 when a 1 was sent is equal to that of deciding on a 0 when a 1 was sent. This is represented by the conditional error probabilities being equal:

$$p(0/1) = p(1/0).$$

The above-described mechanism for decoding error correction codes is optimum subject to the above assumption, which is entirely valid for most communication systems, where the dominant noise is generally additive, and independent of the signal, and where the decision threshold is set in the optimum way, either naturally for signals with a zero mean value, or by an adaptive device.

However, there are applications which, for reasons of channel memory or noise, do not conform to this assumption. The functioning of error correction codes is then sub-optimal. This applies, for example, to passive optical networks (PON) where the channel uses a non-optimum decision threshold. This also applies to telecommunications networks where the channel is subject to a high level of interference between symbols, which leads to a higher probability of error in certain sequences.

The document entitled "Next Generation FEC ("Forward Error Coding") for Optical Transmission Systems" by T. Mizuochi et al. discloses a soft decoding technique that is applied to the decision circuit, on the upstream side of the error correction code decoder, and supplies bit by bit an instantaneous reliability for a sequence of bits and takes that reliability into account in its decision concerning a current bit. The reliability is representative of the confidence that is attached to a decision, and soft decoding amounts to "weighting" a decision by the confidence that can be placed in it.

Figure 1B:
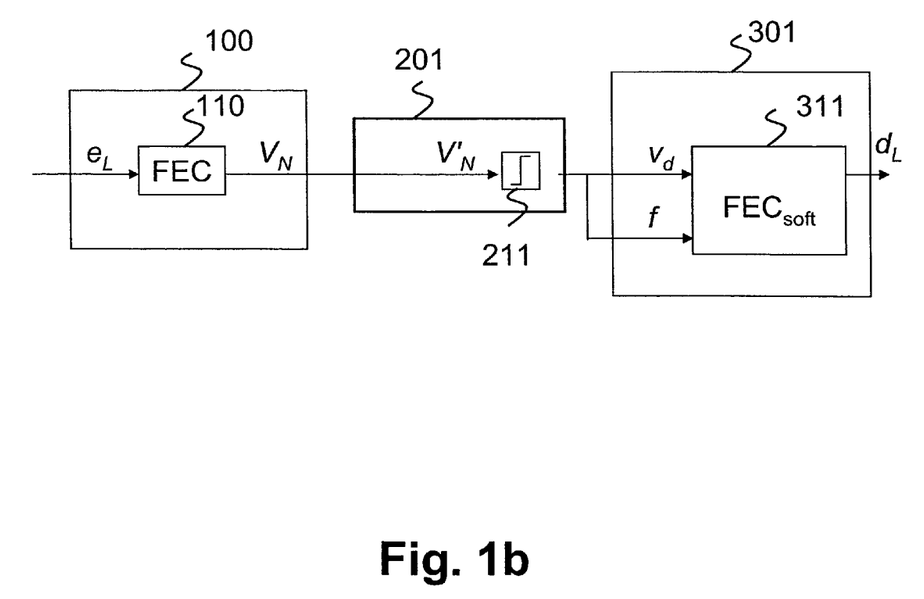
FIG. 1b illustrates the soft decoding technique used by the prior art decision circuit.

FIG. 1b represents a system for transmitting data in a telecommunications network using this prior art soft decoding technique. The decision circuit 211 supplies a decoding device 301 including an error correction code decoder 311 not only with a decision about the received bit, but also with a reliability f evaluated for that bit. Such a decoder 311, also called a soft decoder, can integrate the reliabilities of the bits present in the received decided signal to select the most likely possible word in its dictionary characteristic of the error correction code concerned.

DRAWBACKS OF THE PRIOR ART

A first drawback of the above technique is that modifying the decision circuit in this way makes it extremely complicated, and it becomes difficult and costly to implement.

A second drawback is that, in the field of access networks in particular, the decision circuits that are used are very elementary and cannot implement such complexity.

A particular objective of the invention is to overcome the drawbacks of the prior art.

More precisely, there exists a need for a solution for compensating the asymmetry of the transmission channel at decoder level without making the decision circuit of the receiver more complicated.

The invention responds to that need by providing a method of decoding a decided signal received from a decision circuit to supply a decoded signal, said method comprising:
- a step of detecting a word of N bits in said received decided signal;
- a step of selecting an admissible word of N information bits in a dictionary of the error correction code used for encoding, in accordance with a criterion of the shortest distance between said detected word and said selected admissible word;
- a decoding step intended to provide a word of L bits constituting said decoded signal from said selected admissible word.

The method according to the invention is particular in that the distance used in the selection step takes account of the relative reliabilities of $2^K$ sequences of K bits, $0<K<N$.

Thus the invention is based on an entirely novel and inventive approach to decoding an error correction code. Indeed, the invention proposes taking into account the relative reliability of a sequence of information bits in the process of decoding the decided signal to supply a decoded signal.

Thus the invention solves the technical problem of increasing the correction capacity of the error correction code when used with an asymmetric binary channel, but without making the decision circuit more complex. The method according to the invention also enhances the performance of the error correction code, whilst remaining independent of the decision process.

Such a decoding method uses the relative reliability of a bit or a sequence of bits relative to the other possible bits or sequences of bits. Unlike prior art soft decoding, it does not recompute a new reliability value for each new bit considered. This limits the complexity of the overall decoding process.

According to one aspect of the invention, said distance is a weighted sum of $2^K$ cardinal numbers, wherein the $i^{th}$ cardinal number, $0 \leq i \leq 2^K-1$, of the occurrences of the $i^{th}$ sequence of K information bits in the detected word, such that the $k^{th}$ bit, $0 \leq i \leq K-1$, differs from the $k^{th}$ bit in the selected admissible word, is weighted by an $i^{th}$ reliability coefficient of said $i^{th}$ sequence of K bits. The distance obtained differs from the distances conventionally used to select the closest possible word in that it separates the occurrences of the various sequences of bits. Indeed, while a standard distance is computed as the cardinal number of all the occurrences of sequences of bits that differ between the possible word and the decided signal, the distance in accordance with to the invention is calculated considering the cardinal numbers of each sequence of bits individually and assigning them the usual relative reliability coefficients. This therefore compensates the asymmetry of the binary channel.

According to another aspect of the invention, said reliability coefficients are determined beforehand. The invention then provides a very simple way to compensate asymmetry of the binary transmission channel.

According to a further aspect of the invention, the decoding method comprises:
- a step of suppressing a sequence of N–L redundant bits in the detected word, $0<L<N$, to supply a detected payload word consisting of information bits;
- a first step of counting an $i^{th}$ number $No_i$ of occurrences of the $i^{th}$ sequence $S_i$, $0 \leq i \leq 2^K-1$ of K bits in the detected payload words during a particular time interval T; and
- a first step of evaluating said $i^{th}$ reliability coefficient $c_i$ of the $i^{th}$ sequence $S_i$ of K bits from said $i^{th}$ number $No_i$ of occurrences.

Thus the reliability coefficients are evaluated from a statistic of the received decided signals. The invention thus adapts the distance used by the selection step in time.

According to a further aspect of the invention, the decoding method comprises:
- a step of suppressing a sequence of N–L redundant. bits in the detected word, $0<L<N$, to supply a detected payload word consisting of information bits;
- a second step of counting an $i^{th}$ cardinal number $No'_i$ of occurrences of the sequence $S_i$, $0 \leq i \leq 2^K-1$, of K bits, $0 \leq k \leq K-1$, in the detected payload words during a particular time interval T such that the $k^{th}$ bit differs from that of the corresponding sequence in the decoded signal; and
- a second step of evaluating said $i^{th}$ reliability coefficient $c'_i$ of the $i^{th}$ sequence $S_i$ of K bits from said $i^{th}$ number $No'_i$ of occurrences.

Thus the relative reliability coefficients are evaluated by comparison of the decoded and decided signals, counting the occurrences of the sequences of bits that differ between the decoded signal and the detected word in the decided signal. The invention thus adapts the distance used by the selection step of the subsequent decided signals as a function of the decoded signals obtained previously.

Said counting and evaluation steps are preferably repeated regularly in time, so as to guarantee good adaptation of the distance to the status of the binary channel.

According to a further aspect of the invention, the decoding method comprises:
- a second step of selecting an intermediate admissible word comprising N bits in said dictionary of error correction codes in accordance with a criterion of the shortest distance between said detected word and said admissible intermediate word, on the basis of a second distance equal to the cardinal number of the occurrences of sequences $S_i$ of K bits present in the decided signal, $0 \leq i \leq 2^K-1$, such that the $k^{th}$ bit differs from that of the corresponding sequence in the selected admissible word; and
- a second step of decoding a word of K bits constituting a decoded intermediate signal on the basis of said admissible intermediate word, said decoded intermediate signal being intended to be fed to said second counting step.

This second selection step thus uses a standard distance that is not weighted by reliability coefficients. The decoded signal that it supplies is used by the second evaluation step to calculate the reliability coefficients to be applied to the detected word in the decided signal. This then guarantees that the distance used in the selection step is adapted well and without delay to the decided signal that has just been received.

The invention also provides a decoder of a decided signal received from a decision circuit supplying a decoded signal, said decoder comprising:

means for detecting a word of N bits in said received decided signal, adapted to supply a detected word;

means for selecting an admissible word of N bits in a dictionary of the error correction code used for encoding, in accordance with a criterion of the shortest distance between said detected word and said selected admissible word; and means for decoding a word of L bits constituting said decoded signal from said selected admissible word.

Such a device is particular in that the distance used by said selection means is adapted to take account of the relative reliabilities of $2^K$ sequences of K bits, $0<K<N$.

The invention also provides a decoding device comprising said decoder, said decoder comprising means for suppressing a sequence of N−L redundant bits in the detected word to supply a detected payload word.

Said decoding device is particular in that it comprises:

second means for counting an $i^{th}$ number $No'_i$ of occurrences of the $i^{th}$ sequence $S_k$ of K bits in the detected payload word, $0 \leq i \leq 2^K-1$, such that the $k^{th}$ bit differs from that of the corresponding sequence of the decoded signal; and second means for evaluating said $i^{th}$ reliability coefficient $c'_i$ of the $i^{th}$ sequence of K bits on the basis of said $i^{th}$ number $No'_i$ of occurrences.

The invention also provides a decoding device comprising a second decoder for decoding the decided signal to supply an intermediate decoded signal intended to be supplied to the second counting means.

The invention also provides a receiver comprising a decision circuit adapted to supply a decided signal on the basis of a transmitted signal and a decoder adapted to decode said decided signal, said decoder comprising:

means for detecting a word of N bits in said received decided signal adapted to decode a detected word;

means for selecting an admissible word of N bits in a dictionary of error correction codes in accordance with a criterion of the shortest distance between said detected word and said selected admissible word; and means for decoding a word of L bits constituting said decoded signal from said selected admissible word.

Said receiver is particular in that the distance used by said selection means is adapted to take account of the relative reliabilities of $2^K$ sequences of K bits, $0<K<N$.

The invention finally provides a computer program product downloadable from a communication network and/or stored on a computer-readable medium and/or executable by a microprocessor.

Such a computer program product is particular in that it comprises program code instructions for the execution of the decoding method according to the invention when it is executed on a computer.

LIST OF FIGURES

Other advantages and features of the invention become more clearly apparent on reading the following description of one particular embodiment of the invention, provided by way of illustrative and non-limiting example only, and examining the appended drawings, in which.

DESCRIPTION OF ONE PARTICULAR EMBODIMENT OF THE INVENTION

The general principle of the invention is based on the use by the forward error correction (FEC) error correction code decoder of a pseudodistance that distinguishes errors occurring for sequences of K bits and assigns those errors relative reliabilities. The theory of error correction codes, familiar to the person skilled in the art, is explained in "Introduction to Coding Theory", Ron Roth, Cambridge, ISBN-13: 9780521845045|ISBN-10: 0521845041, for example.

Figure 2:
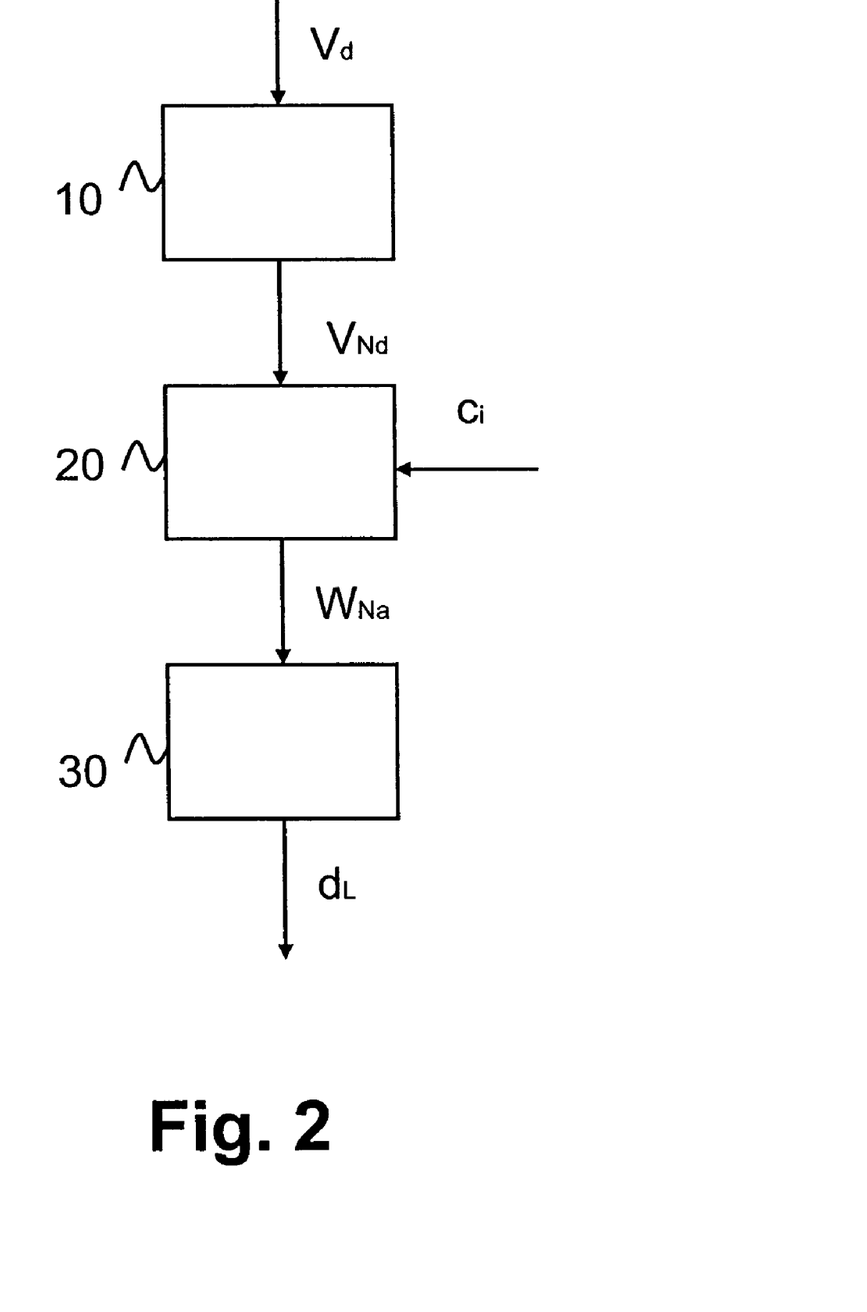
FIG. 2 is a functional diagram of a first embodiment of the decoding method of the invention.

FIG. 2 is a functional diagram of the decoding method of the invention. Such a method comprises:

a step 10 of detecting a word $V_{Nd}$ of N bits in a received decided signal $V_d$;

a step 20 of selecting an admissible word. $W_{Na}$ of N bits in an error correction code dictionary in accordance with a criterion of the shortest distance between said detected word and said selected admissible word; and a step 30 of decoding a word $d_L$ of L bits constituting part of the decoded signal from said selected admissible word $W_{Na}$.

According to one aspect of the invention, the shortest distance criterion used by the selection step 20 is satisfied by a pseudodistance d calculated as the weighted sum of the cardinal numbers of the errors that have occurred in the detected word on the $k^{th}$ bit of a sequence of bits by a reliability coefficient relating to that particular sequence of bits.

Below, for reasons of simplicity, consideration is given initially to isolated bits, i.e. the pseudodistance according to the invention is distinguished among the errors on the "0" bits and the errors on the "1" bits between the word of N bits detected in the decided signal $V_{Nd}$ and the admissible word $W_{Na}$ from the error correction code dictionary used by the FEC decoder. Generalization to the $2^K$ sequences of K bits follows on from this.

In the simple case where the bits are considered in isolation, the pseudodistance to be calculated between the detected word and each of the admissible words belonging to the error correction code dictionary is then no longer the cardinal number of the bits that differ, but rather the weighted sum of the cardinal number of the zeros and of the cardinal number of the ones of the detected word that differ from the admissible word.

The pseudodistance $\tilde{d}$ of the invention can be expressed by the following equation, for example:

$$\tilde{d}(V_{Nd}, W_{Na}) = $$
$$c_0 \, card_{0 \leq i < N}(v_i \mid v_i \neq w_i, w_i = 0) + c_1 card(v_i \mid v_i \neq w_i, w_i = 1) \neq$$
$$\tilde{d}(W_{Na}, V_{Nd})$$

in which $v_i$ is the $i^{th}$ bit of the detected word $V_{Nd}$ and $w_i$ is the $i^{th}$ bit of the admissible word $W_{Na}$.

The weighting coefficients are the reliability coefficients $c_0$ and $c_1$ of the 0 bits and the 1 bits, respectively. These coefficients are a function of the relative reliability of the 0 bits and the 1 bits. They can typically be taken as $-\ln(p(0/1))$ and $-\ln(p(1/0))$, ln indicating the natural logarithm.

Since this function is no longer symmetrical, it is no longer a question of a distance, but of what is called a "pseudodistance", which is distinguished from a conventional distance by adding a ~.

By way of example, consider for example the two words of length 6 $W_{Na}=(0,1,1,0,1,0)$ and $V_{Nd}=(1,0,1,1,0,1)$. Their Hamming distance is 5. The pseudodistance from the preceding equation is $3c_0+2c_1$.

In the more complex case in which the central bit of a sequence xyz of three bits is considered, the pseudodistance $d_y$ according to this aspect of the invention is defined as follows:

$$d_y(V_{Nd}, W_{Na}) = \sum_{i=0}^{2^3-1} c_i \cdot card(x\bar{y}z)$$

In other words, the pseudodistance is then expressed as the weighted sum of the cardinal numbers of the occurrences of the eight possible sequences xyz for which the center bit differs in the detected word $V_{Nd}$ compared to the admissible word $W_a$.

In the general case where $2^K$ sequences of K bits are considered, $0<K<N$, the pseudodistance can be expressed as follows:

$$d_{x_0}(V_{Nd}, W_{Na}) = \sum_{i=0}^{2^{m+r+1}-1} c_i \cdot card(x_{-m} \ldots x_{-1}\bar{x_0}x_1 \ldots x_r);$$

where $x_{-m} \ldots x_0 x_1 \ldots x_r$ is a sequence of K bits, $0<m<K$ and $0<r<K$, and the bit $x_0$ belongs to $V_{Nd}$. According to such a distance, the weighted sum of the cardinal numbers of occurrences of the $2^K$ possible sequences are considered for which the $k^{th}$ bit $x_0$ differs in the detected word $V_{Nd}$ compared to the admissible word $W_{Na}$. This means the central bit, for example, or any other bit of the sequence that belongs to the detected word $V_{Nd}$.

To calculate this pseudodistance, it is necessary to store a context comprising the m decided bits that precede and the r decided bits that follow the detected word $V_{Nd}$.

According to a first embodiment of the invention, the reliability coefficients $\{c_i\}$ are determined beforehand. To be effective, this solution requires a sufficient a priori knowledge of the transmission channel and a statistic of that channel that is stable over time.

Figure 3:
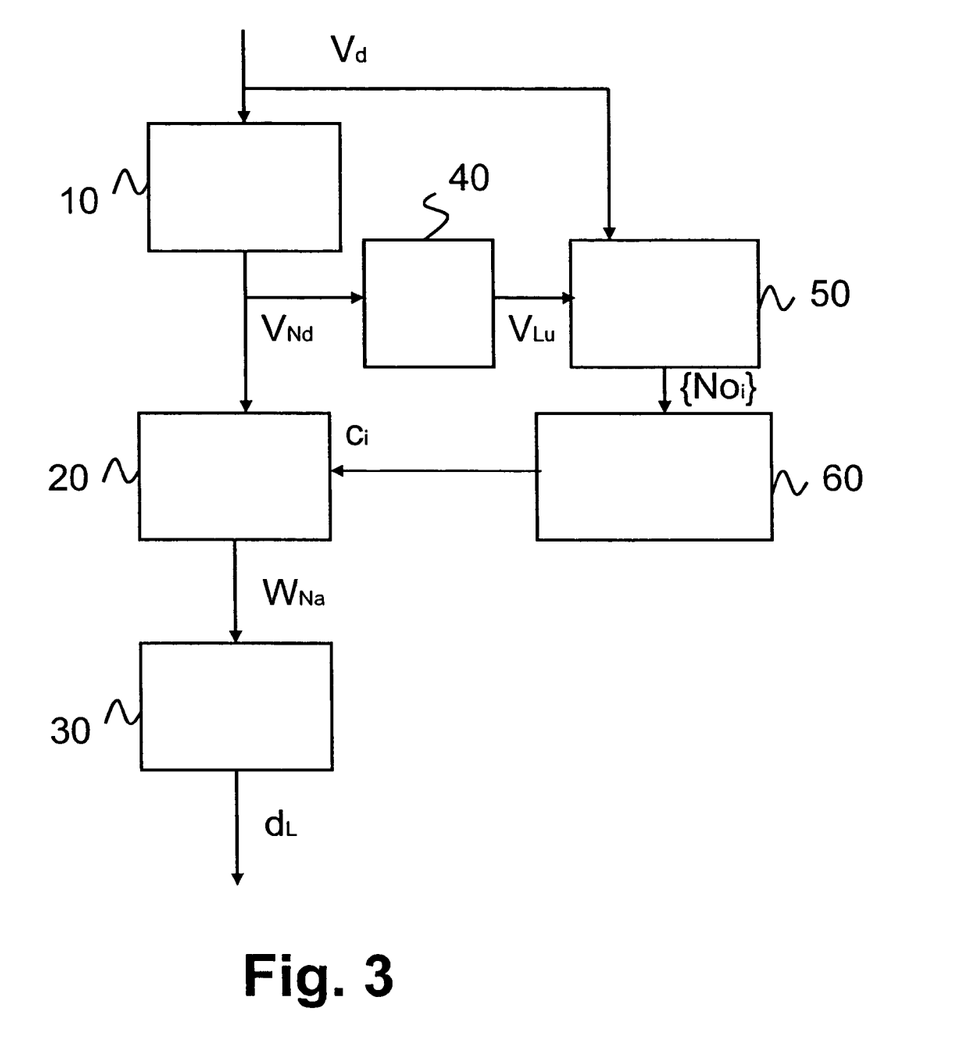
FIG. 3 is a functional diagram of a second embodiment of the decoding method of the invention.

FIG. 3 is a functional diagram of the decoding method according to a second embodiment of the invention. The method comprises in addition to the selection step 10, detection step 20, and decoding step 30:

a step 40 of suppressing a sequence of N−L redundant bits in the detected word $V_{Nd}$, $0<L<N$, intended to supply a word made up of payload information bits $V_{Lu}$;

a first step 50 of counting an $i^{th}$ number Noi of occurrences of the $i^{th}$ sequence $S_i$, $0 \leq i \leq 2^K-1$, of K bits in the detected payload words $\{V_{Lu}(t)\}$ during a particular time interval T; and a first step 60 of evaluating said $i^{th}$ reliability coefficient $c_i$ of the $i^{th}$ sequence $S_i$ of K bits from said $i^{th}$ number $No_i$ of occurrences.

In the simple case where the sequence of bits comprises only one bit, the first counting step 50 amounts to counting the number of decided "1" and the number of decided "0".

In the more complex case of a sequence of bits comprising more than one bit, for example a sequence xyz of three bits, the first counting step 50 amounts to counting the number of occurrences of the sequence xyz in the decided signal during the time period T.

The first step 60 of evaluating the reliability coefficients then consists in evaluating the coefficients $c_i$ by normalizing the numbers $No_i$ of occurrences obtained, for example, in the following manner:

$$c_i = \left(1 - C^{st} \cdot \frac{No_i}{\sum_{j=0}^{2^K-1} No_j}\right)$$

where $C^{st}$ is a constant.

Figure 4:
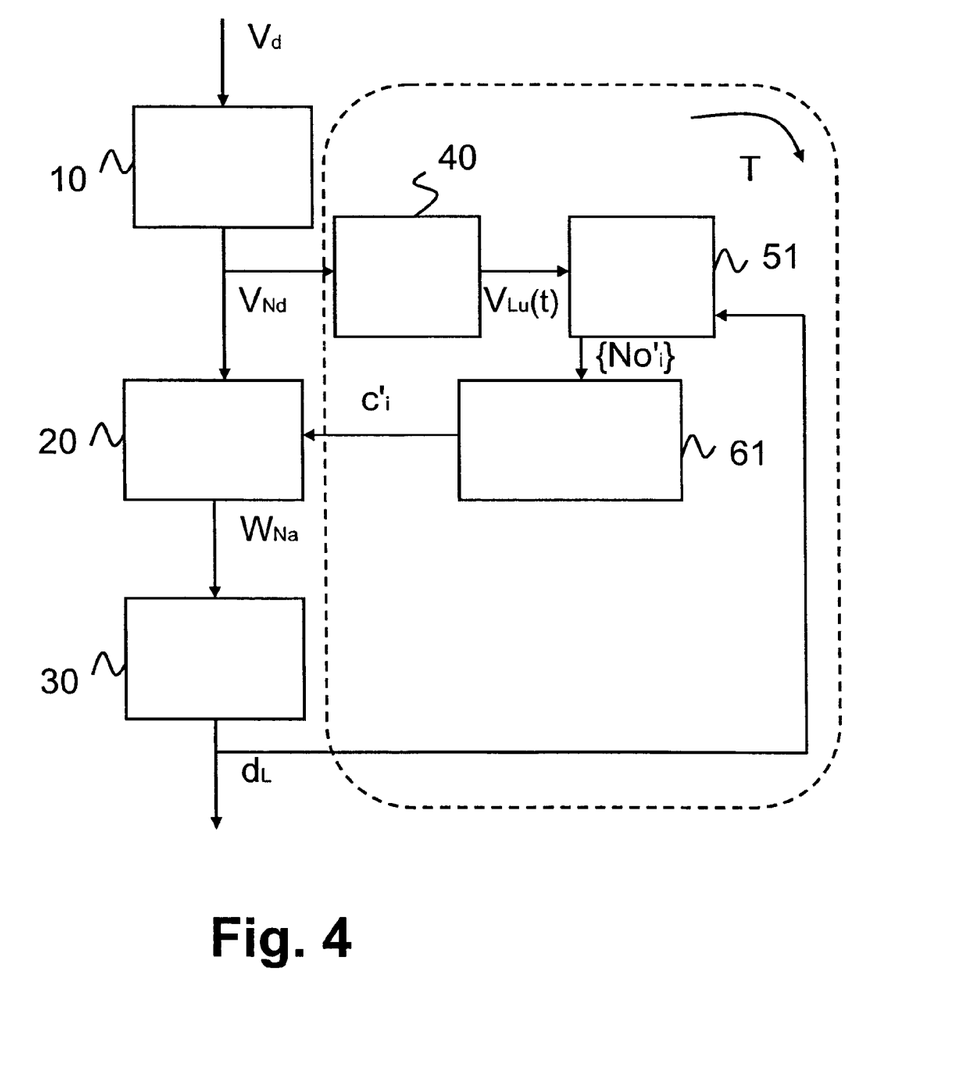
FIG. 4 is a functional diagram of a third embodiment of the decoding method of the invention.

FIG. 4 is a functional block diagram of a third embodiment of the decoding method according to the invention. The method comprises in addition to the selection step 10, detection step 20, and decoding step 30:

a step 40 of suppressing a sequence of N−L redundant bits in the detected word $V_{Nd}$ to supply a detected payload word $V_{Lu}$;

a second step 51 of counting an $i^{th}$ cardinal number $No'_i$ of occurrences of the sequence $S_i$, $0 \leq i \leq 2^{K1}-1$, of K bits in the detected payload words $\{V_{Lu}(t)\}$ during a particular time interval T, such that the $k^{th}$ bit differs from that of the corresponding sequence in the decoded signal $V_{Nd}$; and a second step 61 of evaluating said $i^{th}$ reliability coefficient $c'_i$ of the $i^{th}$ sequence $S_i$ of K bits from the $i^{th}$ number $No'_i$ of occurrences.

In the simple case where the sequence of bits comprises only one bit, the second counting step 51 amounts to counting the number of decided "1" and the number of decided "0" that differ from those of the decoded signal.

The second evaluation step 61 then evaluates the reliability coefficients $c_i$, for example in a manner similar to that described in the preceding embodiment:

$$c_i = \left(1 - C^{st} \cdot \frac{No'_i}{\sum_{j=0}^{2^K-1} No'_j}\right)$$

In one variant, the second evaluation step 61 evaluates conditional probabilities $p(0/1)$ and $p(1/0)$ in the following manner:

$$p(0/1) = \frac{No'_0}{card_{d_L}(1)}$$

where $card_{d_L}(1)$ represents the cardinal number of the 1 bits present in the decoded signal;

$$p(1/0) = \frac{No'_1}{card_{d_L}(0)}$$

where $card_{d_L}(0)$ represents the cardinal number of the 0 bits present in the decoded signal.

The reliability coefficients $c_i$ are then derived in a valid manner by applying to these conditional probabilities a natural logarithm type function:

$$c_0 = -\ln(p(0/1))$$

$$c_1 = -\ln(p(1/0))$$

In the more complex case of a sequence of bits comprising more than one bit, for example a sequence xyz of three bits, the second counting step 51 amounts to counting, during the time period T, the number $No'_i$ of occurrences of the sequence $x\bar{y}z$ in the decoded signal, while the $i^{th}$ sequence xyz is present in the decoded signal.

The second evaluation step 61 then evaluates the reliability coefficients $c_i$, for example in a similar manner to that described in the simple case.

This embodiment extracts the reliability coefficients of error statistics of the FEC decoder evaluated over a time period T.

Figure 5:
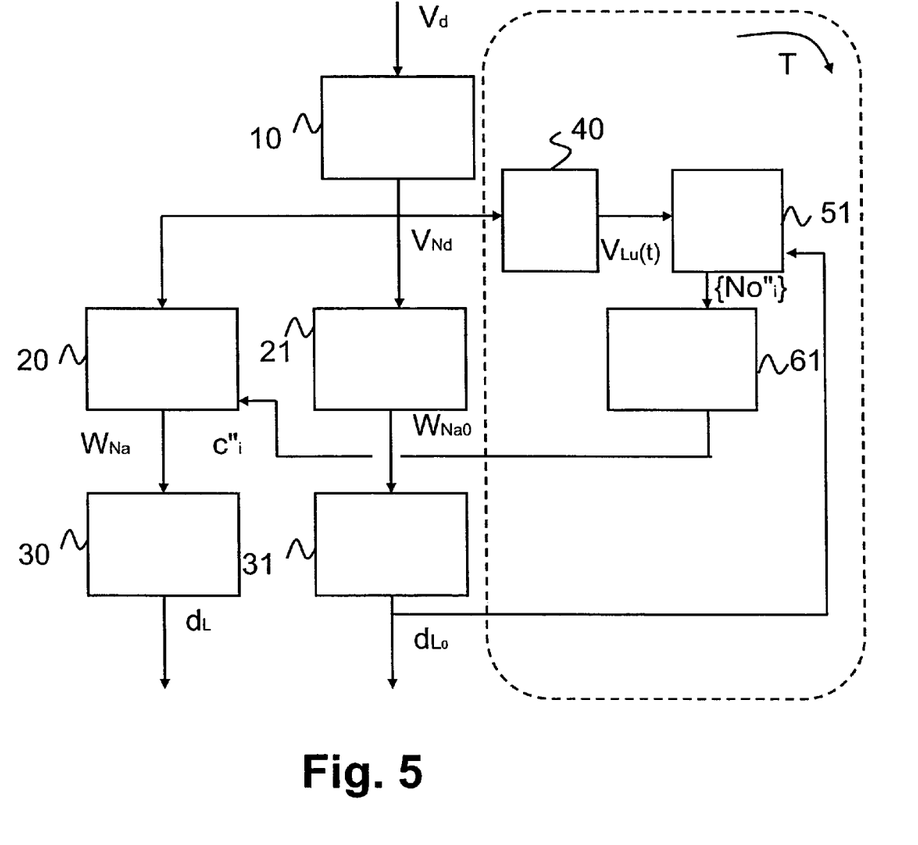
FIG. 5 is a functional diagram of a fourth embodiment of the decoding method of the invention.

FIG. 5 is a functional block diagram of a fourth embodiment of a decoding method according to the invention. The method comprises in addition to the selection step 10, detection step 20, decoding step 30, elimination step 40, counting steps 50, 51, and evaluation steps 60, 61:

a second step 21 of selecting an admissible intermediate word $W_{Na0}$ comprising N bits in said dictionary of error correction codes according to a criterion of the shortest distance between said detected word $V_{Nd}$ and said admissible intermediate word $W_{Na0}$, on the basis of a second distance equal to the cardinal number of the occurrences of sequences $S_i$ of K bits present in the decided signal, $0 \leq i \leq 2^K - 1$, such that the $k^{th}$ bit differs from that of the corresponding sequence in the admissible intermediate word $W_{Na0}$; and a second step 31 of decoding a word of L bits constituting a decoded intermediate signal $d_{L0}$ on the basis of said admissible intermediate word $W_{Na0}$, said decoded intermediate signal being intended to be supplied to the said counting step 51.

This embodiment extracts error statistics of a second FEC decoder using a standard distance. If the signal is not too degraded, these statistics estimate $p(0/1)$ and $p(1/0)$ in the simple case in which the sequence of bits comprises only one bit and the probability $p(\bar{y}/xyz)$ in the case of a sequence of bits comprising more than one bit, for example a sequence xyz of three bits.

Figure 6A:
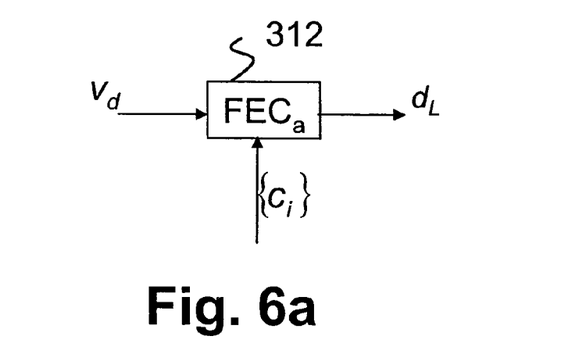
FIG. 6a is a block diagram illustrating the functional structure of a first embodiment of a decoding device according to the invention.

FIG. 6a shows an $FEC_a$ decoder 312 according to a first embodiment of the invention. Such a decoder comprises:

means for detecting a word of N bits in said received decided signal to supply a detected word;

means for selecting an admissible word of N bits in a dictionary of error correction codes on the basis of a criterion of the shortest distance between said detected word and said admissible selected word; and means for decoding a word of L bits constituting said decoded signal from said admissible selected word.

For reasons of clarity, these means are not represented in FIG. 6a. According to the invention, the distance used by said selection means is adapted to take account of the relative reliabilities of $2^K$ sequences of K bits, $0 < K < N$. According to a first aspect of the invention, it is a question of a pseudodistance that estimates the weighted sum of $2^K$ cardinal numbers, the $i^{th}$ cardinal number, $0 \leq i \leq 2^K - 1$, representing the occurrences of the $i^{th}$ sequence of K bits in the decided signal, such that the $k^{th}$ bit, $0 \leq i \leq K-1$, differs from the $k^{th}$ bit in the decoded signal by an $i^{th}$ reliability coefficient of said $i^{th}$ sequence of K bits.

According to a first embodiment of the invention, the reliability coefficients are determined beforehand.

Figure 6B:
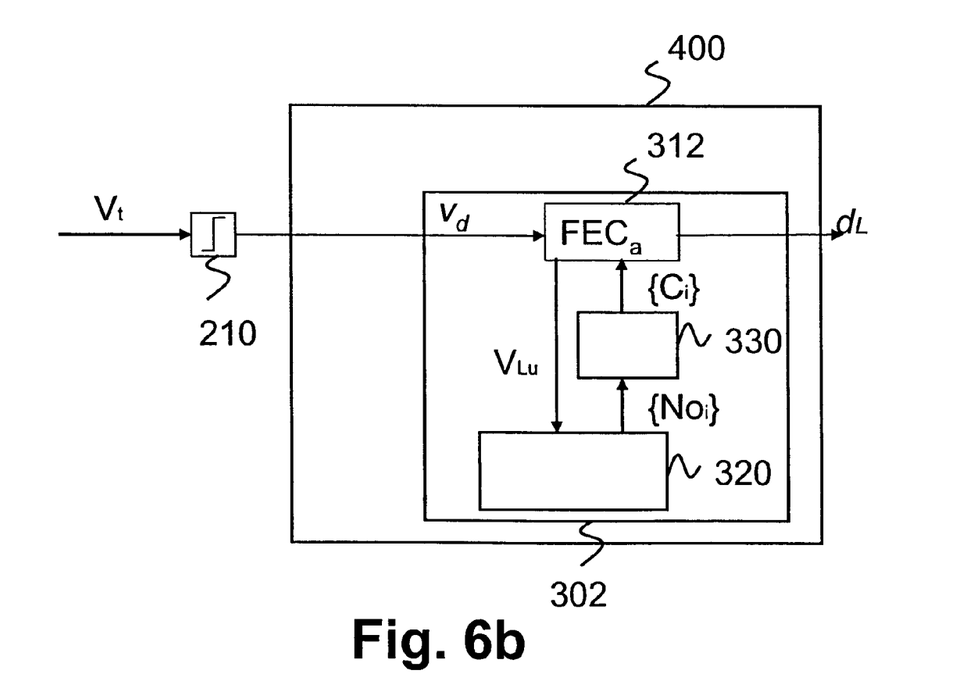
FIG. 6b is a block diagram illustrating the functional structure of a second embodiment of a decoding device according to the invention.

FIG. 6b shows a receiver 400 comprising a second embodiment of a decoding device 302 according to the invention. Such a decoding device comprises:

the $FEC_a$ decoder 312;

first means 320 for counting an $i^{th}$ number $No_i$ of occurrences of the $i^{th}$ sequence $S_i$ of K bits in the decided signals during a particular time interval, $0 \leq i \leq 2^K - 1$; and first means 330 for evaluating said $i^{th}$ reliability coefficient $c_i$ of the $i^{th}$ sequence $S_i$ of K bits on the basis of said $i^{th}$ number $No_i$ of occurrences.

Figure 7A:
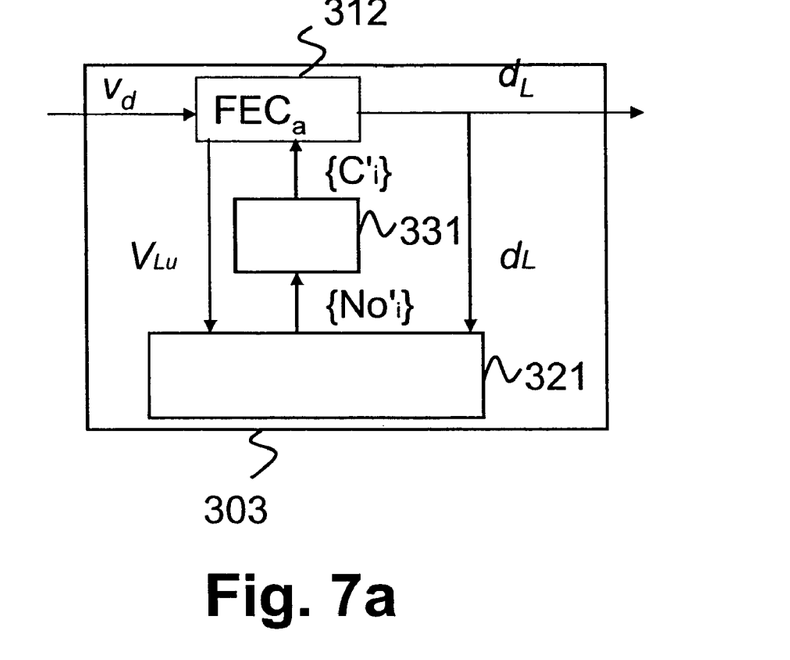
FIG. 7a is a block diagram illustrating the functional structure of a third embodiment of a decoding device according to the invention.

FIG. 7a shows a third embodiment of a decoding device 303 according to the invention. Such a decoding device comprises:

the $FEC_a$ decoder;

second means 321 for counting an $i^{th}$ number $No'_i$ of occurrences of the $i^{th}$ sequence $S_i$ of K bits in the decided signal, $0 \leq i \leq 2^K - 1$, such that the $k^{th}$ bit differs from that of the corresponding sequence of the decoded signal; and second means 331 for evaluating said $i^{th}$ reliability coefficient $c'_i$ of the $i^{th}$ sequence $S_i$ of K bits on the basis of said $i^{th}$ number $No'_i$ of occurrences.

Figure 7B:
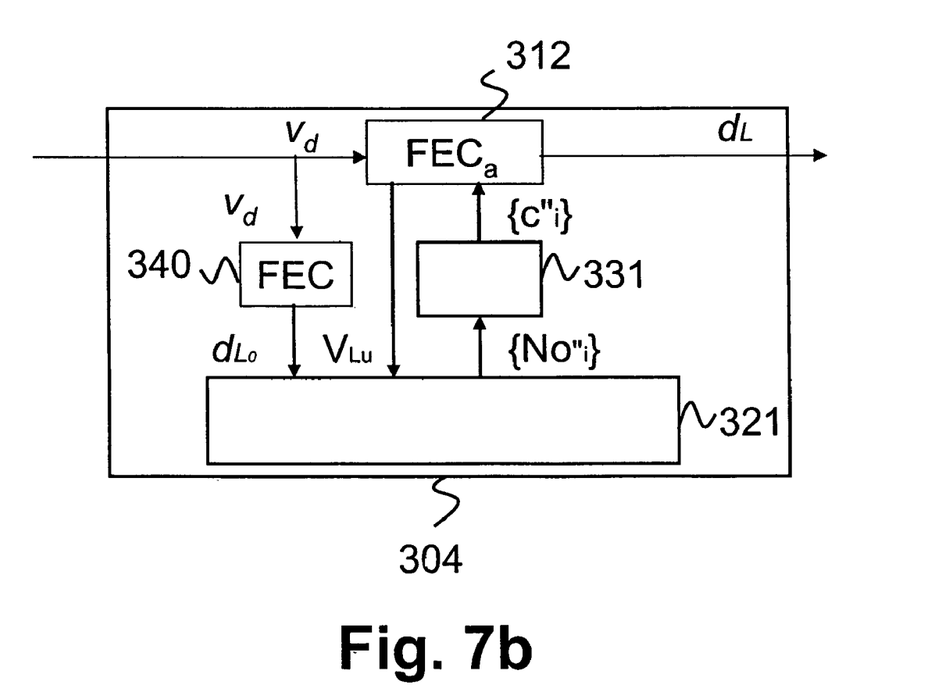
FIG. 7b is a block diagram illustrating the functional structure of a fourth embodiment of a decoding device according to the invention.

FIG. 7b shows a fourth embodiment of a decoding device 304 according to the invention. Such a device comprises a second FEC decoder 340 adapted to decode the decided signal to supply a decoded intermediate signal intended to be supplied to the second counting means 321.

To illustrate the invention, there is considered next a simple example of an error correction code, namely the triple repetition code. When such a code is used:

to transmit 0, the sequence '0 0 0' is sent;

to transmit 1, the sequence '1 1 1' is sent.

When using a standard FEC decoder using the Hamming distance on a symmetric binary channel, the received sequences give the decoded information set out in table 1 below:

TABLE 1

| Decided | 000 | 001 | 010 | 011 | 100 | 101 | 110 | 111 |
|---|---|---|---|---|---|---|---|---|
| Distance from 000 | 0 | 1 | 1 | 2 | 1 | 2 | 2 | 3 |
| Distance from 111 | 3 | 2 | 2 | 1 | 2 | 1 | 1 | 0 |
| Decoder output | 0 | 0 | 0 | 1 | 0 | 1 | 1 | 1 |

If the decoding device according to the invention uses the hypothesis that 1s are much less reliable than 0s (this is the typical situation of a decision threshold that is set too low), the decoded information obtained at the output is as set out in table 2 below, in which $c_1=0.3$ and $c_2=0.7$:

TABLE 2

| Pseudodistance d | Decided | 000 | 001 | 010 | 011 | 100 | 101 | 110 | 111 |
|---|---|---|---|---|---|---|---|---|---|
| | from 000 | 0 | $c_1$ | $c_1$ | $2c_1\,c_1$ | $c_1$ | $2c_1\,c_1$ | $2c_1\,c_1$ | $3c_1\,c_1$ |
| | from 111 | $3c_2\,c_2$ | $2c_2\,c_2$ | $2c_2\,c_2$ | $c_2\,c_2$ | $2c_2\,c_2$ | $c_2$ | $c_2$ | 0 |
| | from 000 | 0 | 0.3 | 0.3 | 0.6 | 0.3 | 0.6 | 0.6 | 0.9 |
| | from 111 | 2.1 | 1.4 | 1.4 | 0.7 | 1.4 | 0.7 | 0.7 | 0 |
| | Decoder output | 0 | 0 | 0 | 0 | 0 | 0 | 0 | 1 |

Figure 8:
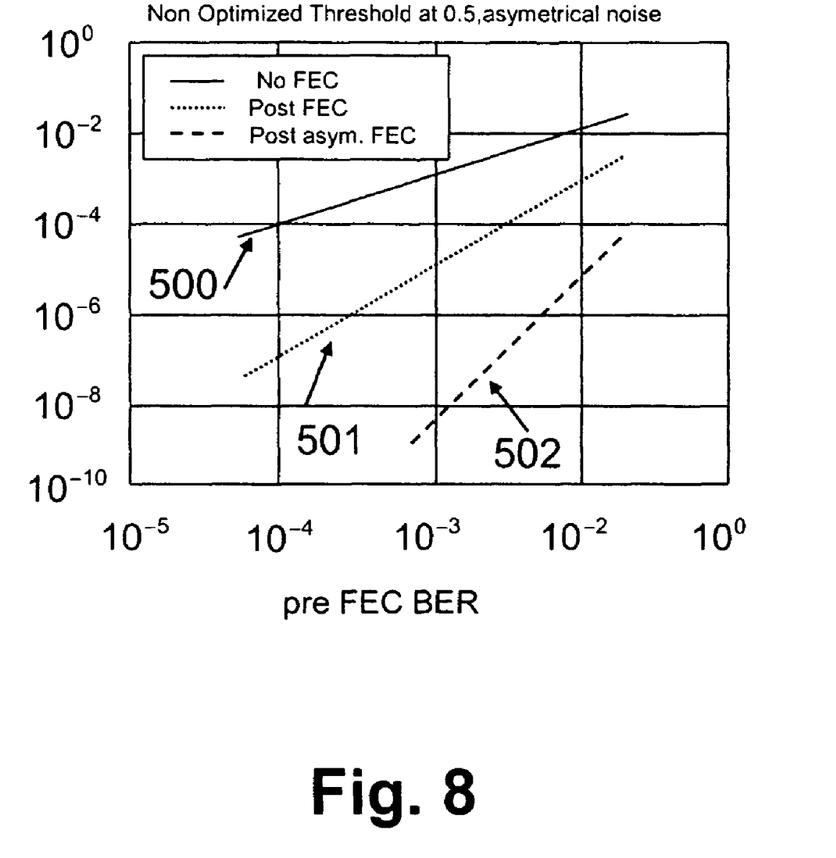
FIG. 8 shows a series of curves for comparing the performance variations of the decoding devices of the invention and the prior art as a function of the input error rate in the decoding device.

FIG. 8 shows a series of simulated curves 500, 501, 502 based on the preceding example. A non-symmetrical binary channel is emulated by a channel using a non-optimum threshold. The curve 500 represents the error probability at the output of a decoder that does not use error correction code, the curve 501 represents the output error probability of a standard FEC decoder, and the curve 502 represents the output error probability of a decoding device according to the invention. Such curves are used to compare the variations in the performance of decoding devices according to the invention and according to the prior art as a function of the error probability at the input of the decoding device.

They show that using the decoding method according to the invention in a transmission system significantly improves the output error rate by taking account of the different reliability of the 0s and the 1s.

What is claimed is:

1. A method of decoding a decided signal received from a decision circuit to supply a decoded signal, said method comprising:
   a step of detecting a word of N bits in said received decided signal;
   a step of selecting an admissible word of N bits in a dictionary of the error correction code used for encoding, in accordance with a criterion of the shortest distance between said detected word and said selected admissible word; and
   a decoding step intended to supply a word of L bits constituting said decoded signal from said selected admissible word;
   wherein the determined shortest distance used in the selection step takes account of relative reliabilities of $2^K$ sequences of K bits in the detected word, $0 < K < N$.

2. A decoding method according to claim 1, wherein the determined shortest distance is a weighted sum of $2^K$ cardinal numbers, wherein the $i^{th}$ cardinal number, $0 \leq i \leq 2^K - 1$, represents the occurrences of the $i^{th}$ sequence of K bits in the detected word, such that the $k^{th}$ bit, $0 \leq k \leq K-1$, of the $i^{th}$ sequence of K bits differs from that of a corresponding sequence in the selected admissible word, is weighted by an $i^{th}$ reliability coefficient of said $i^{th}$ sequence of K bits.

3. A decoding method according to claim 2, wherein said reliability coefficients, including the $i^{th}$ reliability coefficient, are determined beforehand.

4. A decoding method according to claim 2, comprising:
   a step of suppressing a sequence of N minus L redundant bits in the detected word to supply a detected payload word consisting of information bits;
   a first step of counting an $i^{th}$ number ($No_i$) of occurrences of the $i^{th}$ sequence $S_i$, $0 \leq i \leq 2^K - 1$, of K bits in the detected payload words during a particular time interval T; and
   a first step of evaluating said $i^{th}$ reliability coefficient of the $i^{th}$ sequence of K bits from said $i^{th}$ number $No_i$ of occurrences.

5. A decoding method according to claim 2, comprising:
   a step of suppressing a sequence of N minus L redundant bits in the detected word to supply a detected payload word consisting of information bits;
   a second step of counting an $i^{th}$ cardinal number ($No'_i$) of occurrences of the $i^{th}$ sequence $S_i$, $0 \leq i \leq 2^K - 1$, of K bits in the detected payload words during a particular time interval T such that the $k^{th}$ bit differs from that of the corresponding sequence in the decoded signal; and
   a second step of evaluating said $i^{th}$ reliability coefficient ($c'_i$) of the $i^{th}$ sequence $S_i$ of K bits from said $i^{th}$ number ($No'_i$) of occurrences.

6. A decoding method according to claim 5, comprising:
   a step of suppressing a sequence of N minus L redundant bits in the detected word to supply a detected payload word consisting of information bits;
   a first step of counting an $i^{th}$ number ($No_i$) of occurrences of the $i^{th}$ sequence $S_i$, $0 \leq i \leq 2^K - 1$, of K bits in the detected payload words during a particular time interval T; and
   a first step of evaluating said $i^{th}$ reliability coefficient of the $i^{th}$ sequence of K bits from said $i^{th}$ number ($No_i$) of occurrences, wherein said first step of counting and said first step of evaluation are repeated regularly in time.

7. A decoding method according to claim 5, comprising:
   a second step of selected an intermediate admissible word comprising N bits in said dictionary of the error correction code in accordance with a criterion of a second determined shortest distance between said detected word and said admissible intermediate word, on the basis of a second distance equal to the cardinal number of the occurrences of sequences $S_i$ of K bits present in the decided signal, $0 \leq i \leq 2^K - 1$, such that the $k^{th}$ bit differs from that of the corresponding sequence in the selected admissible word; and
   a second step of decoding a word of K bits constituting a decoded intermediate signal on the basis of said admissible intermediate word, said decoded intermediate signal being intended to be fed to said second counting step.

8. A decoder of a decided signal received from a decision circuit to supply a decoded signal, said decoder comprising:
a detection circuit configured to detect a word of N bits in said received decided signal;
a selection circuit configured to select an admissible word of N bits in a dictionary of an error correction code used for encoding, in accordance with a criterion of a determined shortest distance between said detected word and said selected admissible word; and
a decoding circuit configured to decode a word of L bits constituting said decoded signal from said selected admissible word;
wherein the determined shortest distance used by said selection circuit is adapted to take account of relative reliabilities of $2^k$ sequences of K bits in the detected word, $0<K<N$.

9. A decoding device comprising the decoder according to claim 8, said decoder comprising means for suppressing a sequence of N minus L redundant bits in the detected word to supply a detected payload word consisting of information bits, said device comprising:
a first counting circuit configured to count an $i^{th}$ number ($No_i$) of occurrences of the $i^{th}$ sequence $S_i$ of K bits, $0 \leq i \leq 2^K-1$, in the detected payload words during a particular time interval T;
an first evaluation circuit configured to evaluate said $i^{th}$ reliability coefficient ($c'_i$) of the $i^{th}$ sequence $S_i$ of K bits on the basis of said $i^{th}$ number ($No_i$) of occurrences.

10. A decoding device comprising the decoder according to claim 8, said decoder comprising a circuit configured to suppress a sequence of N minus L redundant bits in the detected word, $0<L<N$, to supply a detected payload word consisting of information bits, said device comprising:
a second counting circuit configured to count an $i^{th}$ number ($No'_i$) of occurrences of the $i^{th}$ sequence of K bits $S_k$ in the detected payload word, $0 \leq i \leq 2^K-1$, such that the $k^{th}$ bit differs from that of the corresponding sequence of the decoded signal;
second counting circuit configured to evaluate said $i^{th}$ reliability coefficient ($c'_i$) of the $i^{th}$ sequence of K bits $S_k$ on the basis of said $i^{th}$ number ($No'_i$) of occurrences.

11. A decoding device according to claim 10, comprising a second decoder adapted to decode the decided signal to supply a decoded intermediate signal intended to be supplied to the second counting circuit.

12. A receiver comprising a decision circuit adapted to supply a decided signal on the basis of a received signal and a decoder adapted to decode said decided signal to produce a decoded signal, said decoder comprising:
a detection circuit configured to detect a word of N bits in said decided signal adapted to decode said detected word;
a selection circuit configured to select an admissible word of N bits in a dictionary of an error correction code in accordance with a criterion of a determined shortest distance between said detected word and said selected admissible word; and
a decoding circuit configured to decode a word of L bits constituting said decoded signal from said selected admissible word;
wherein the determined shortest distance used by said selection circuit is adapted to take account of relative reliabilities of $2^k$ sequences of K bits in the detected word, $0<K<N$.

13. A computer program product stored on a non-transitory computer-readable medium, the computer program product comprising program code instructions for executing the decoding method according to claim 1 when it is executed on a computer.

14. A computer program stored on a computer memory and executing on a processor which, when used on a computer apparatus, causes the processor to execute steps of the decoding method according to claim 1.

* * * * *